US008843791B2

(12) United States Patent
Mittal et al.

(10) Patent No.: US 8,843,791 B2
(45) Date of Patent: Sep. 23, 2014

(54) MEMORY ERROR MANAGEMENT SYSTEM

(71) Applicants: Sarthak Mittal, Delhi (IN); Kshitij Bajaj, Ghaziabad (IN); Prashant Bhargava, Gurgaon (IN)

(72) Inventors: Sarthak Mittal, Delhi (IN); Kshitij Bajaj, Ghaziabad (IN); Prashant Bhargava, Gurgaon (IN)

(73) Assignee: Freescale Semiconductor, Inc., Austin, TX (US)

( * ) Notice: Subject to any disclaimer, the term of this patent is extended or adjusted under 35 U.S.C. 154(b) by 130 days.

(21) Appl. No.: 13/759,054

(22) Filed: Feb. 5, 2013

(65) Prior Publication Data

US 2014/0223239 A1  Aug. 7, 2014

(51) Int. Cl.
*G06F 11/00* (2006.01)
*G06F 11/07* (2006.01)

(52) U.S. Cl.
CPC .................................. *G06F 11/0727* (2013.01)
USPC .......................................................... 714/48

(58) Field of Classification Search
CPC . G06F 11/0793; G06F 11/1441; G06F 12/00; G06F 3/0634
USPC .......................................................... 714/48
See application file for complete search history.

(56) References Cited

U.S. PATENT DOCUMENTS 7,283,380 B1  10/2007  Srinivasan
2007/0083792 A1  4/2007  McDermott

OTHER PUBLICATIONS

Xin Li, Michael Huang, Kai Shen and Lingkun Chu, "A Realistic Evaluation of Memory Hardware Errors and Software System Susceptibility," USENIX Annual Technical Conference, Jun. 23-25, 2010.
Andi Kleen, "mcelog: memory error handling in user space," Linux Kongress 2010, Sep. 2010.

*Primary Examiner* — Jigar Patel
(74) *Attorney, Agent, or Firm* — Charles Bergere

(57) ABSTRACT

A memory error management system connected to memory channels for managing errors detected in corresponding memory devices includes a reporting table including a list of historically reported errors, a binary value representing the current error status of the memory channels, a uniqueness check module for checking whether a historically reported error is reappearing as a current error, an error mask register for generating a masked binary value representing unique current errors in the memory channels, and a channel arbitration module for decoding the channel identifiers of corrupted memory channels from the masked binary value and storing the decoded channel identifiers into the reporting table.

20 Claims, 4 Drawing Sheets

MEMORY ERROR MANAGEMENT SYSTEM

BACKGROUND OF THE INVENTION

The present invention generally relates to integrated circuits, and more particularly, to a memory error management system for an integrated circuit.

Many integrated circuits (IC) include one or more memories, such as Random Access Memory (RAM), Dynamic RAM (DRAM), and Static RAM (SRAM). The operations of the memories are controlled by a memory controller and the memories communicate with the memory controller through memory channels. Memory channels carry information, such as a corresponding channel identifier, a memory address of a corresponding memory and corresponding data/error bits. The memories are prone to errors, such as transient errors, bit flips, and the like. A memory error management system may be connected to the memory channels to identify and record the corrupted memory channel(s) using the information carried by the memory channels.

One known existing memory error management system receives the channel identifier, memory address and corresponding error bits of each memory channel and decodes memory channels containing error(s) in a current memory cycle. Thereafter, the memory error management system checks whether the decoded memory channel(s) and corresponding error(s) in the current memory cycle have already been identified and recorded in a database in previous memory cycles. When a match for a current error is present in the database, the current error is tagged as a duplicate error and the decoded information pertaining to the duplicate error is discarded. If no match is found, the current error is tagged as a unique error and the corresponding error information is stored in the database.

Thus, a lot of time and resources are used to decode memory channels that contain duplicate errors. When the memory error management system is engaged in repetitive decoding of memory channels containing duplicate or recurring errors, the decoding of memory channels containing new unique errors may either be delayed, or the new unique errors may be reported as overflows. In some applications, it is crucial not to let a unique error in the memory device go undetected and corrective action is required to be taken quickly.

Therefore, it would be advantageous to have a memory error management system that reduces decoding of corrupted memory channels corresponding to duplicate errors, that reduces the probability of overflow of unique errors, and that overcomes the above-mentioned limitations of the existing error management systems.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements. It is to be understood that the drawings are not to scale and have been simplified for ease of understanding the invention.

DETAILED DESCRIPTION OF THE PRESENT INVENTION

Figure 1:
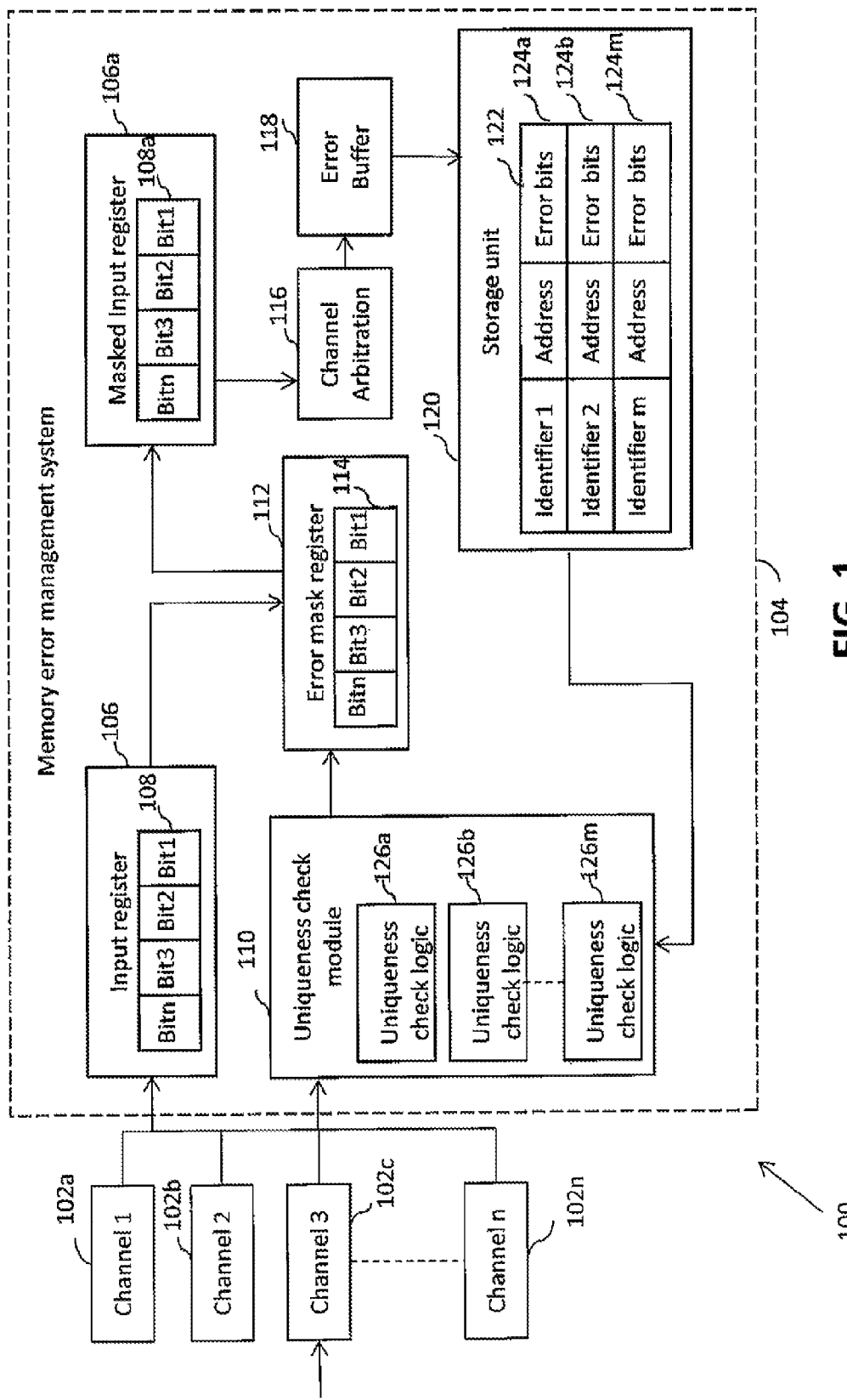
FIG. 1 is a schematic block diagram of a memory system including a memory error management system in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a memory system is provided. The memory system includes a plurality of memory devices and a plurality of memory channels for reporting at least one error detected in the plurality of memory devices. A memory error management system is connected to the plurality of memory channels for managing errors detected in the memory devices. The memory error management system includes a storage unit for storing a reporting table that includes a reported channel identifier, a reported memory address, and a reported set of error bits corresponding to each historically reported error. An input register is connected to the plurality of memory channels for receiving a channel identifier, a memory address, and a set of error bits corresponding to each memory channel, and storing a binary value that includes a plurality of bits. The bit positions of the bits of the binary value correspond to a channel identifier of a memory channel. A bit of the binary value is set when an error is detected in a corresponding memory channel and reset when no error is detected in the corresponding memory channel. A uniqueness check module is connected to the input register and the storage unit, and receives the channel identifier, the memory address and the set of error bits from the input register, and generates a first output when a memory address and a corresponding set of error bits of a memory channel in which an error is detected match with a reported memory address and a corresponding reported set of error bits from the reporting table, respectively. An error mask register is connected to the uniqueness check module and the input register. The error mask register inverts a bit of the binary value corresponding to the memory channel in which the error is detected, based on the first output, and generates a masked binary value in a masked input register. A channel arbitration module is connected to the masked input register and the storage unit. The channel arbitration module decodes the masked binary value to identify a channel identifier corresponding to the memory channel in which the error is detected, and stores the channel identifier, corresponding memory address, and set of error bits in to the reporting table.

In another embodiment of the present invention, a memory error management system for managing a plurality of errors detected in a memory is provided. The memory includes a plurality of memory devices having a plurality of memory channels for reporting at least one error detected in the plurality of memory devices. The memory error management system is connected to the plurality of memory channels and includes a storage unit for storing a reporting table that includes a reported channel identifier, a reported memory address, and a reported set of error bits corresponding to each historically reported error. An input register is connected to the plurality of memory channels and receives a channel identifier, a memory address, and a set of error bits corresponding to each memory channel. A binary value is stored that includes a plurality of bits and a position of each bit of the binary value corresponds to a channel identifier of a memory channel. A bit of the binary value is set when an error is detected in a corresponding memory channel and reset when an error is not detected in the corresponding memory channel. A uniqueness check module is connected to the input register and the storage unit, receives the channel identifier, the memory address and the set of error bits from the input register, and generates a first output when a memory address and a corresponding set of error bits of a memory channel in which an error is detected match with a reported memory address and a corresponding reported set of error bits from the reporting table, respectively. An error mask register is connected to the uniqueness check module and the input register. The error mask register inverts a bit of the binary value corresponding to the memory channel in which the error is detected, based on the first output, and generates a masked binary value in a masked input register. A channel arbitration module is connected to the masked input register and the storage unit. The channel arbitration module decodes the masked binary value to identify a channel identifier corresponding to the memory channel in which the error is detected, and stores the channel identifier, and corresponding memory address and set of error bits in to the reporting table.

Various embodiments of the present invention provide a memory error management system for managing the errors detected in one or more memory devices. The memory error management system includes an input register for storing a binary value representing current errors in each memory channel, and a reporting table for storing a plurality of historically reported errors. A uniqueness check module matches current address and error bits of a reported channel identifier with corresponding reported address and error bits to check whether a historically reported error corresponding to the reported channel identifier is reappearing as a current error. An error mask register modifies the binary value based on output of the uniqueness check module to generate a masked binary value that represents only unique errors in the memory channels. A channel arbitration module decodes the masked binary value to identify channel identifier(s) corresponding to unique error(s), and stores the decoded channel identifier(s) into the reporting table. The uniqueness check module discards the duplicate errors before the channel arbitration stage which reduces resources and time used for decoding of memory channels corresponding to duplicate errors, and increases the efficiency of decoding memory channels corresponding to new unique errors. The channel arbitration module includes multiple two-input encoders for decoding the channel identifiers, as compared to existing channel arbitration modules that include a single encoder for decoding all channel identifiers. The multiple two-input encoders collectively acquire less area in the chip as compared to the area acquired by a single large encoder.

Referring now to FIG. 1, a memory system 100 used in an integrated circuit (not shown) in accordance with an embodiment of the present invention is shown. The integrated circuit may include a microprocessor unit (MPU), a microcontroller unit (MCU), a system-on-chip (SoC), an application specific integrated circuit (ASIC), or the like. The memory system 100 includes first through nth memory channels 102a-102n (collectively referred to as memory channels 102) connected to a plurality of memory devices (not shown). Each memory channel 102 is identified using a channel identifier. The channel identifier may include an index of a memory channel 102. For example, the first memory channel 102a is identified by the channel identifier "1", the second memory channel 102b is identified by the channel identifier "2", and so forth.

In an embodiment of the present invention, the memory devices connected to the memory channels 102 are configured to perform self error-checking operations for detecting any errors therein, and in each memory cycle, each memory channel 102 carries a corresponding channel identifier, memory address, and a set of error bits reported from a corresponding memory device. The memory address represents a location of the memory device where an error may be detected, and the set of error bits indicates whether there is an error present at a corresponding memory address, whether the error is correctable or uncorrectable, and the position of erred bit in the corresponding memory address. In an embodiment of the present invention, the memory address and corresponding set of error bits of a memory channel 102 are hereinafter collectively referred to as address and error bits of the memory channel 102. The address and error bits of a memory channel 102 in a current memory cycle are hereinafter referred to as current address and error bits of the memory channel 102.

The memory system 100 further includes a memory error management system 104 connected to the memory channels 102 for managing errors detected in the memory devices. The memory error management system 104 includes an input register 106, a uniqueness check module 110, an error mask register 112, a channel arbitration module 116, an error buffer 118, and a storage unit 120.

The input register 106 is connected to the memory channels 102 for receiving a channel identifier, and current address and error bits for each memory channel 102. The input register 106 stores a binary value 108 that represents error status of each memory channel 102 in the current memory cycle. The number of bits of the binary value 108 is equal to the number of memory channels 102. A position of a bit in the binary value 108 represents a channel identifier of a memory channel 102, and the bit value indicates error status of a corresponding memory channel 102. In an embodiment of the present invention, a bit in the binary value 108 is set (assigned value 1) when corresponding current address and error bits indicate an error, and is reset (assigned value 0) when the corresponding current address and error bits do not indicate an error. For example, the third bit of the binary value 108 that stores a bit value of '1' represents the third memory channel 102c and indicates that it contains an error in the current memory cycle. Similarly, the second bit that stores a bit value of '0' represents the second memory channel 102b and indicates that the channel 102b is error-free in the current memory cycle. The errors present in the memory channels 102 in the current memory cycle are hereinafter referred to as current errors.

The storage unit 120 stores a reporting table 122, which includes first through mth errors 124a-124m (collectively referred to as historically reported errors 124) detected and reported in previous memory cycles. Each historically reported error 124 is represented by a plurality of parameters, such as a reported channel identifier of a corresponding memory channel 102, and reported address and error bits.

The uniqueness check module 110 receives the channel identifier, and current address and error bits of each memory channel 102 from the memory channels 102, and the plurality of historically reported errors 124 from the reporting table 122. The uniqueness check module 110 includes first through mth uniqueness check logic modules 126a-126m (collectively referred to as uniqueness check logic modules 126) to determine the historically reported errors 124 reappearing as current errors.

A first uniqueness check logic module 126a extracts a first channel identifier of a first historically reported error 124a from the reporting table 122. Thereafter, the first uniqueness check logic module 126a compares the current address and error bits of the first channel identifier with reported address and error bits of the first channel identifier. The first uniqueness check logic module 126a generates a first output when the current address and error bits match with the reported address and error bits and generates a second output when the current address and error bits do not match with the reported address and error bits. The first output indicates that a current error corresponding to the first channel identifier is similar to the first historically reported error 124a, and is not unique. In a similar manner, the second through mth uniqueness check logic modules 126b-126m perform uniqueness checks for current errors corresponding to channel identifiers of the historically reported errors 124b-124m respectively and generate first and second outputs thereof.

The error mask register 112 stores an error mask value 114 representing memory channels 102 containing duplicate errors, based on first and second outputs of the uniqueness check logic modules 126. The number of bits of the error mask value 114 is equal to the number of memory channels 102. A position of a bit in the error mask value 114 represents a channel identifier of a memory channel 102, and the bit value is output of corresponding uniqueness check logic module 126. In an embodiment of the present invention, a bit in the error mask value 114 is set (assigned value 1) when the first output is generated for the corresponding channel identifier and is reset (assigned value 0) when the second output is generated for the corresponding channel identifier. For example, the third bit of the error mask value 114 that stores a bit value of 1 represents the third memory channel 102c and indicates that the first output is generated for the channel identifier '3' and the third memory channel 102 contains a duplicate error. Similarly, the second bit that stores a bit value of 0 represents the second memory channel 102b and indicates that the second output may be generated for the channel identifier '2', and the second memory channel 102b does not contain a duplicate error.

The error mask register 112 modifies the binary value 108 based on the error mask value 114 to generate a masked binary value 108a in the masked input register 106a. In an embodiment of the present invention, a bit in the binary value 108 is inverted when a corresponding bit in the error mask value 114 has a first output. For example, the third bit of the binary value 108 that stores a bit value of '1' is inverted to store value '0' when the third bit of the error mask value 114 stores a value '1'. Thus, a current error corresponding to the third bit is discarded by the error mask register 112, when the current error is a duplicate error. The error mask register 112 inverts one or more bits of the binary value 108 to generate the masked binary value 108a that represents channel identifiers containing only unique errors.

In an embodiment of the present invention, the memory error management system 104 also includes an error overflow register (not shown) connected to the uniqueness check module 110. The error overflow register stores information of duplicate errors discarded by the uniqueness check module 110. The error overflow register may store the discarded duplicate errors as overflows.

The channel arbitration module 116 decodes the masked binary value 108a to identify the channel identifiers corresponding to the memory channels 102 in which unique errors are present. In an embodiment of the present invention, the channel arbitration module 116 identifies at most two channel identifiers from the masked binary value 108a in one memory cycle and reports errors corresponding to remaining channel identifiers as overflows in the error overflow register.

The error buffer 118 stores one of the decoded channel identifiers, and corresponding memory address and error bits into the reporting table 122 in a memory cycle, and buffers another decoded channel identifier for storing in to the reporting table 122 in next memory cycle.

Figure 2:
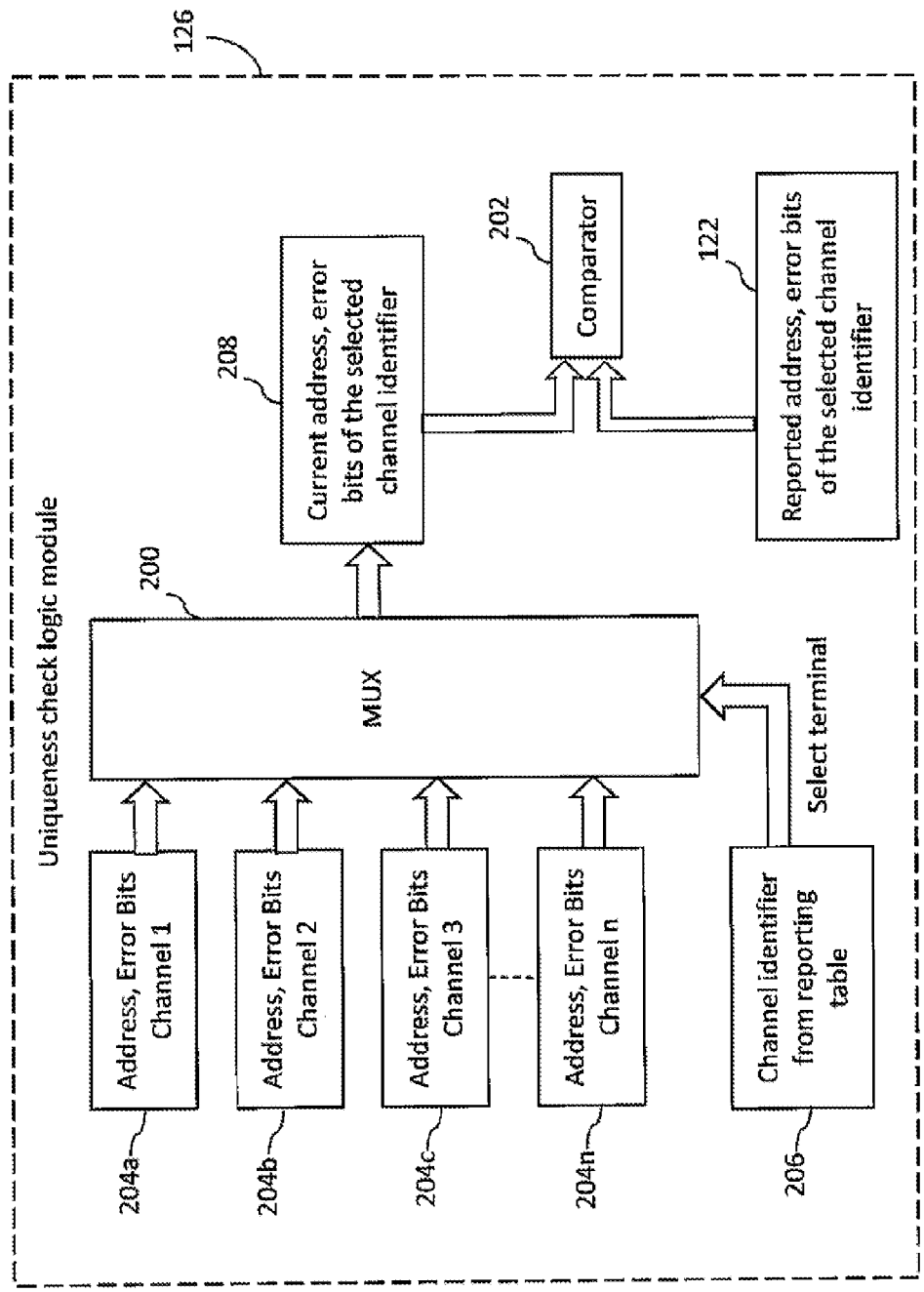
FIG. 2 is a schematic block diagram of a uniqueness check logic module in accordance with an embodiment of the present invention.

Referring now to FIG. 2, a uniqueness check logic module 126 in accordance with an embodiment of the present invention is shown. The uniqueness check logic module 126 includes a multiplexer 200 and a comparator 202. The multiplexer 200 includes first through nth input terminals 204a-204n (collectively referred to as input terminals 204) for receiving a channel identifier, and current address and error bits of the first through nth memory channels 102a-102n, respectively. The multiplexer 200 further includes a select terminal 206 for receiving a channel identifier from the reporting table 122, and an output terminal 208 for generating the current address and error bits corresponding to a selected channel identifier.

The comparator 202 includes a first input terminal for receiving the current address and error bits of the selected channel identifier from the output terminal 206, and a second input terminal for receiving the reported address and error bits of the selected channel identifier from the reporting table 122. The output terminal of the comparator 202 generates the first output when the current address and error bits match with the reported address and error bits, and generates the second output when the current address and error bits does not match with the reported address and error bits. In an embodiment of the present invention, the first output is represented by value '1' and the second output is represented by value '0'.

Figure 3:
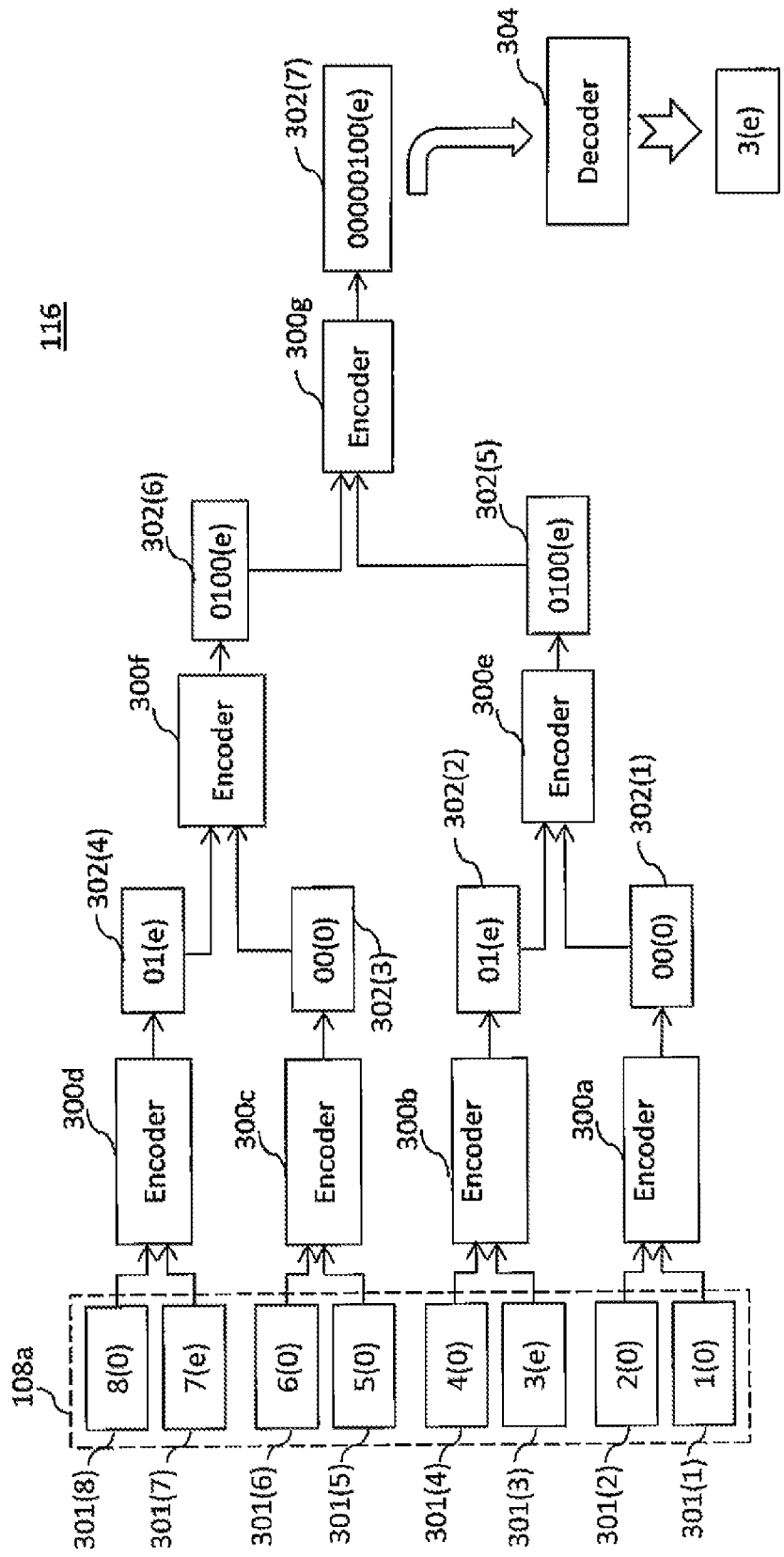
FIG. 3 is a schematic block diagram of a channel arbitration module in accordance with an embodiment of the present invention.

Referring now to FIG. 3, the channel arbitration module 116 in accordance with an embodiment of the present invention is shown. The channel arbitration module 116 decodes the masked binary value 108a to identify at most two channel identifiers corresponding to the memory channels 102 in which unique errors are detected.

The operation and construction of the channel arbitration module 116 has been explained with respect to the masked binary value 108a having a value of '0e000e00', which indicates that the third and seventh memory channels 102 include unique errors. The value of error bit 'e' is preferably equal to '1'. The channel arbitration module 116 includes first through seventh encoders 300a-300g (collectively referred to as encoders 300) for encoding the masked binary value 108a for setting a single bit thereof and resetting other bits. The channel arbitration module 116 further includes a decoder 304 for decoding a channel identifier corresponding to the set bit. For example, the encoded binary variable 302(7) encoded as 00000100 by the encoders 300 includes only one bit (third bit) set as one and the remaining bits set as zero, irrespective of multiple set bits in the masked binary value 108a. The decoder 304 decodes the channel identifier as '3' corresponding to the third set bit.

The channel arbitration module 116 may additionally include a second set of first through seventh encoders 300a-300g (not shown) for generating a second encoded binary variable 302(7) (not shown) which includes seventh bit as set bit and remaining other bits as zero. The channel arbitration module 116 may additionally include a second decoder 304 (not shown) for decoding the channel identifier as '7' corresponding to the seventh set bit.

The masked binary value 108a includes a first lower bit 301(1), a first upper bit 301(2), a second lower bit 301(3), a second upper bit 301(4), a third lower bit 301(5), a third upper bit 301(6), a fourth lower bit 301(7), and a fourth upper bit 301(8). Each encoder 300 receives two inputs and generates an encoded output containing at most one error bit. When both inputs of the encoder 300 contain error bits, the encoder 300 carries forward error bit of only one input and discards error bit of the other input. For example, the encoder 300a generates an error-free two-bit output 302(1) as there is no error in bits 301(1) and 301(2), the encoder 300b generates a two-bit output 302 (2) containing an error bit corresponding to the bit 301(3), the encoder 300c generates an error-free two-bit output 302(3) as there is no error in bits 301(5) and 301(6), and the encoder 300d generates a two-bit output 302 (4) containing an error bit corresponding to the bit 301(7). The encoder 300e generates a four-bit output 302(5) containing an error bit corresponding to error bit of 302(2). The encoder 300f generates a four-bit output 302(6) containing an error bit corresponding to error bit of 302(4). The encoder 300g discards error bit of 302(6) and carries forward error bit of 302(5) in the encoded binary variable output 302(7). Thus, the encoded binary variable 302(7) includes only error bit at third position. The decoder 304 decodes the position of the error bit to identify channel identifier as "3" as explained in the foregoing description.

Figure 4:
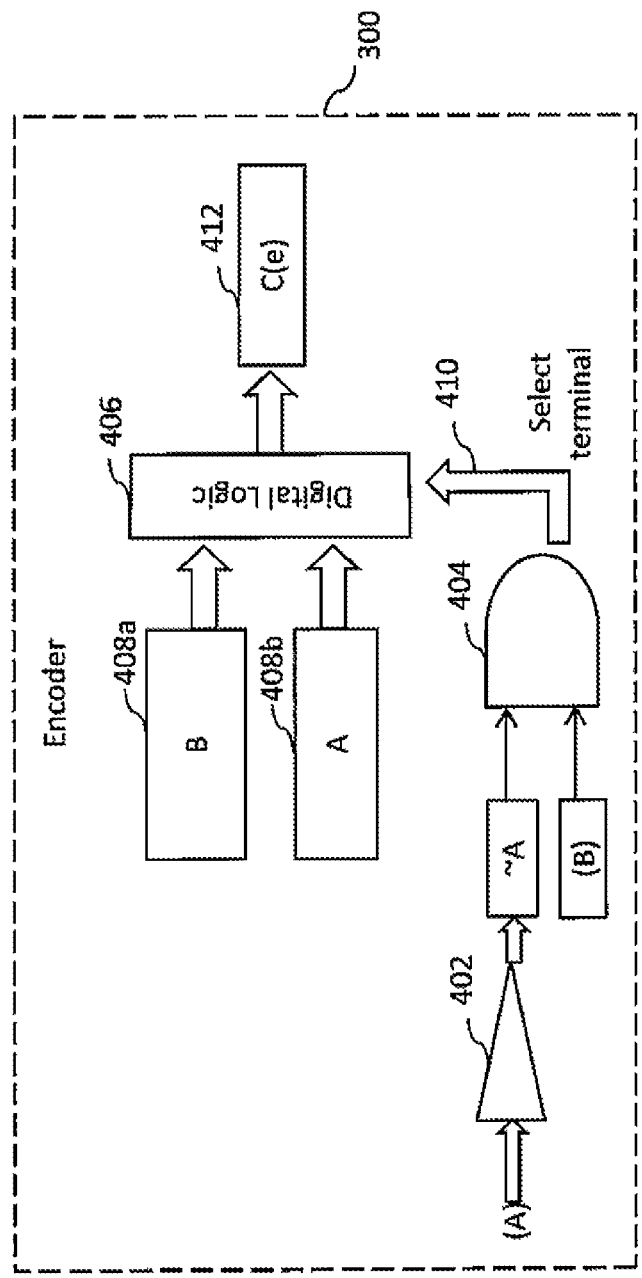
FIG. 4 is a schematic block diagram of an encoder of the channel arbitration module of FIG. 3 in accordance with an embodiment of the present invention.

Referring now to FIG. 4, an encoder 300 of the channel arbitration module 116 for encoding a first input A and a second input B, in accordance with an embodiment of the present invention, is shown. The encoder 300 includes a NOT gate 402 for receiving and inverting the first input A, an AND gate 404, and a digital logic module 406. The AND gate 404 includes a first input terminal connected to the NOT gate 402, a second input terminal for receiving the second input B, and an output terminal. The digital logic module 406 includes first and second input terminals 408a and 408b for receiving the first and second inputs respectively, a select terminal 410 connected to the output terminal of the AND gate 404, and an output terminal 412 for generating an output C.

The digital logic module 406 generates the output C having total number of bits equal to number of combined bits of inputs A and B. For example, the output C includes two bits when inputs A and B include single bit. The output C includes four bits, when inputs A and B include two bits, and so forth. The output C includes at most one error bit and remaining bits as zeroes. The output C includes an error bit corresponding to the first input A when the first input A includes an error bit (i.e., bit 1). The output C includes an error bit corresponding to the second input B when the second input B includes an error bit (i.e., bit 1). The output C includes an error bit corresponding to the first input A when both the first and second inputs A and B include error bits. The output C does not include an error bit when none of the first and second inputs A and B include an error bit.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

It also will be understood by those of skill in the art that the invention may be embodied to use either positive or negative logic, and that combinatorial circuitry may be formed using other logic gates yet providing the same signals.

The invention claimed is:

1. A memory system, comprising:
   a plurality of memory devices having a plurality of memory channels for reporting at least one error detected in the plurality of memory devices; and
   a memory error management system connected to the plurality of memory channels for managing the at least one error detected in the plurality of memory devices, the memory error management system including:
      a storage unit for storing a reporting table, wherein the reporting table includes a reported channel identifier, a reported memory address, and a reported set of error bits corresponding to historically reported errors;
      an input register connected to the plurality of memory channels for receiving a channel identifier, a memory address, and a set of error bits corresponding to each memory channel, and storing a binary value that includes a plurality of bits, wherein a position of each bit of the binary value corresponds to a channel identifier of a memory channel, and wherein a bit of the binary value is set when an error is detected in a corresponding memory channel and reset when no error is detected in the corresponding memory channel;
      a uniqueness check module, connected to the input register and the storage unit, for receiving the channel identifier, the memory address and the set of error bits from the input register, and generating a first output when a memory address and a corresponding set of error bits of a memory channel in which an error has been detected match a reported memory address and a corresponding reported set of error bits from the reporting table, respectively;
      an error mask register, connected to the uniqueness check module and the input register, for inverting a bit of the binary value corresponding to the memory channel in which the error has been detected, based on the first output, and generating a masked binary value
      a masked input register connected to the error mask register for storing the masked binary value; and
      a channel arbitration module, connected to the masked input register and the storage unit, for decoding the masked binary value to identify a channel identifier corresponding to the memory channel in which the error has been detected, and storing the channel identifier, and corresponding memory address and set of error bits in the reporting table.

2. The memory system of claim 1, wherein the uniqueness check module comprises:
   a multiplexer having a plurality of input terminals connected to a corresponding plurality of memory channels, wherein each input terminal receives a channel identifier, a memory address and a set of error bits from a corresponding memory channel, a select terminal for receiving a reported channel identifier corresponding to a historically reported error, and an output terminal for outputting a memory address and a set of error bits of a memory channel corresponding to the reported channel identifier; and
   a comparator connected to the output terminal of the multiplexer and having a first input terminal for receiving a memory address and a set of error bits corresponding to the reported channel identifier, a second input terminal for receiving the reported memory address and the reported set of error bits corresponding to the reported channel identifier, and an output terminal for generating the first output when the memory address and the set of error bits corresponding to the reported channel identifier match with the corresponding reported memory address and set of error bits, and generating a second output when the memory address and the set of error bits corresponding to the reported channel identifier do not match with the corresponding reported memory address and set of error bits.

3. The memory system of claim 1, further comprising an error buffer connected to the channel arbitration module for storing the decoded channel identifier, the corresponding memory address and set of error bits.

4. The memory system of claim 1, wherein the channel arbitration module encodes the masked binary value for setting a single bit thereof and resetting other bits, and decodes a channel identifier corresponding to the set bit.

5. The memory system of claim 4, wherein the masked binary value includes a first lower bit, a first upper bit, a second lower bit, and a second upper bit corresponding to four channels of the plurality of channels, and wherein the channel arbitration module encodes the first lower and upper bits to generate a first two-bit value that includes at most one set bit, encodes the second lower and upper bits to generate a second two-bit value that includes at most one set bit, and encodes the first and second two-bit values to generate a four-bit value that includes at most one set bit, and wherein the channel arbitration module decodes the four-bit value to identify the channel identifier corresponding to the at most one set bit.

6. The memory system of claim 5, wherein the channel arbitration module comprises a plurality of encoders for resolving the masked binary value, wherein each encoder resolves two bits of the masked binary value.

7. The memory system of claim 6, wherein each encoder comprises:
a NOT gate for receiving and inverting a lower bit of the masked binary value;
an AND gate having a first input terminal connected to the NOT gate, for receiving the inverted lower bit and a second input terminal for receiving an upper bit of the masked binary value, and generating an output signal; and
a digital logic module having first and second input terminals for receiving the lower and upper bits, respectively, a select terminal connected to the AND gate for receiving the output signal, wherein the digital logic module selectively outputs at least one of the lower and upper bits at an output terminal thereof.

8. A memory system, comprising:
a plurality of memory devices having a plurality of memory channels for reporting at least one error detected in the plurality of memory devices; and
a memory error management system connected to the plurality of memory channels for managing the at least one error detected in the plurality of memory devices, the error management system including:
a storage unit for storing a reporting table, wherein the reporting table includes a reported channel identifier, a reported memory address, and a reported set of error bits corresponding to each historically reported error;
an input register connected to the plurality of memory channels for receiving a channel identifier, a memory address, and a set of error bits corresponding to each memory channel, and storing a binary value that includes a plurality of bits, wherein a position of each bit of the binary value corresponds to a channel identifier of a memory channel, and wherein a bit of the binary value is set when an error is detected in a corresponding memory channel and reset when an error is not detected in the corresponding memory channel;
a uniqueness check module connected to the input register and the storage unit, wherein the uniqueness check module comprises:
a multiplexer having a plurality of input terminals connected to corresponding plurality of memory channels, wherein each input terminal receives a channel identifier, a memory address and a set of error bits from a corresponding memory channel, a select terminal for receiving a reported channel identifier corresponding to a historically reported error, and an output terminal for outputting a memory address and a set of error bits of a memory channel corresponding to the reported channel identifier; and
a comparator connected to the output terminal of multiplexer and having a first input terminal for receiving a memory address and a set of error bits corresponding to the reported channel identifier, a second input terminal for receiving the reported memory address and the reported set of error bits corresponding to the reported channel identifier from the reporting table; and an output terminal for generating a first output when the memory address and the set of error bits corresponding to the reported channel identifier match with the corresponding reported memory address and the reported set of error bits, and generating a second output when the memory address and the set of error bits corresponding to the reported channel identifier do not match with the corresponding reported memory address and the reported set of error bits;
an error mask register connected to the uniqueness check module and the input register, for inverting a bit of the binary value corresponding to the memory channel in which the error is detected based on the first output, and generating a masked binary value in a masked input register; and
a channel arbitration module connected to the masked input register and the storage unit for decoding the masked binary value to identify a channel identifier corresponding to the memory channel in which the error is detected, and storing the channel identifier, and a corresponding memory address and a corresponding set of error bits in to the reporting table.

9. The memory system of claim 8, further comprising an error buffer connected to the channel arbitration module for storing the decoded channel identifier, the corresponding memory address and set of error bits.

10. The memory system of claim 8, wherein the channel arbitration module encodes the masked binary value for setting a single bit of the masked binary value and resetting other bits, and decodes a channel identifier corresponding to the set bit.

11. The memory system of claim 10, wherein the masked binary value includes a first lower bit, a first upper bit, a second lower bit, and a second upper bit corresponding to four channels of the plurality of channels, and wherein the channel arbitration module encodes the first lower and upper bits to generate a first two-bit value that includes at most one set bit, encodes the second lower and upper bits to generate a second two-bit value that includes at most one set bit, and encodes the first and second two-bit values to generate a four-bit value that includes at most one set bit, and wherein the channel identifier decodes the four-bit value to identify the channel identifier corresponding to the at most one set bit.

12. The memory system of claim 11, wherein the channel arbitration module comprises a plurality of encoders for resolving the masked binary value, wherein each encoder resolves two bits of the masked binary value.

13. The memory system of claim 12, wherein each encoder comprises:
- a NOT gate for receiving and inverting a lower bit of the masked binary value;
- an AND gate having a first input terminal connected to the NOT gate, for receiving the inverted lower bit and a second input terminal for receiving an upper bit of the masked binary value, and generating an output signal; and
- a digital logic module having first and second input terminals for receiving the lower and upper bits, respectively, a select terminal connected to the AND gate for receiving the output signal, wherein the digital logic module selectively outputs at least one of the lower and upper bits at an output terminal thereof.

14. A memory error management system for managing errors detected in a memory, wherein the memory includes a plurality of memory devices and a plurality of memory channels for reporting at least one error detected in the plurality of memory devices, and wherein the memory error management system is connected to the plurality of memory channels, the memory error management system comprising:
- a storage unit for storing a reporting table, wherein the reporting table includes a reported channel identifier, a reported memory address, and a reported set of error bits corresponding to each historically reported error;
- an input register connected to the plurality of memory channels for receiving a channel identifier, a memory address, and a set of error bits corresponding to each memory channel, and storing a binary value that includes a plurality of bits, wherein a position of each bit of the binary value corresponds to a channel identifier of a memory channel, and wherein a bit of the binary value is set when an error is detected in a corresponding memory channel and reset when an error is not detected in the corresponding memory channel;
- a uniqueness check module, connected to the input register and the storage unit, for receiving the channel identifier, the memory address and the set of error bits from the input register, and generating a first output when a memory address and a corresponding set of error bits of a memory channel in which an error is detected match with a reported memory address and a corresponding reported set of error bits from the reporting table, respectively;
- an error mask register, connected to the uniqueness check module and the input register, for inverting a bit of the binary value corresponding to the memory channel in which the error is detected, based on the first output, and generating a masked binary value in a masked input register; and
- a channel arbitration module, connected to the masked input register and the storage unit, for decoding the masked binary value to identify a channel identifier corresponding to the memory channel in which the error is detected, and storing the channel identifier, and corresponding memory address and set of error bits in to the reporting table.

15. The memory error management system of claim 14, wherein the uniqueness check module comprises:
- a multiplexer having a plurality of input terminals connected to corresponding plurality of memory channels, wherein each input terminal receives a channel identifier, a memory address and a set of error bits from a corresponding memory channel, a select terminal for receiving a reported channel identifier corresponding to a historically reported error, and an output terminal for outputting a memory address and a set of error bits of a memory channel corresponding to the reported channel identifier; and
- a comparator connected to the output terminal of the multiplexer and having a first input terminal for receiving a memory address and a set of error bits corresponding to the reported channel, a second input terminal for receiving the reported memory address and the reported set of error bits corresponding to the reported channel identifier, and an output terminal for generating the first output when the memory address and the set of error bits corresponding to the reported channel identifier match with the corresponding reported memory address and set of error bits, and generating a second output when the memory address and the set of error bits corresponding to the reported channel identifier do not match with the corresponding reported memory address and set of error bits.

16. The memory error management system of claim 14, further comprising an error buffer connected to the channel arbitration module for storing the decoded channel identifier, the corresponding memory address and set of error bits.

17. The memory error management system of claim 14, wherein the channel arbitration module encodes the masked binary value for setting a single bit thereof and resetting other bits, and decodes a channel identifier corresponding to the set bit.

18. The memory error management system of claim 17, wherein the masked binary value includes a first lower bit, a first upper bit, a second lower bit, and a second upper bit corresponding to four channels of the plurality of channels, and wherein the channel arbitration module encodes the first lower and upper bits to generate a first two-bit value that includes at most one set bit, encodes the second lower and upper bits to generate a second two-bit value that includes at most one set bit, and encodes the first and second two-bit values to generate a four-bit value that includes at most one set bit, and wherein the channel arbitration module decodes the four-bit value to identify the channel identifier corresponding to the at most one set bit.

19. The memory error management system of claim 18, wherein the channel arbitration module comprises a plurality of encoders for resolving the masked binary value, wherein each encoder resolves two bits of the masked binary value.

20. The memory error management system of claim 19, wherein each encoder comprises:
- a NOT gate for receiving and inverting a lower bit of the masked binary value;
- an AND gate having a first input terminal connected to the NOT gate, for receiving the inverted lower bit and a second input terminal for receiving an upper bit of the masked binary value, and generating an output signal; and
- a digital logic module having first and second input terminals for receiving the lower and upper bits, respectively, a select terminal connected to the AND gate for receiving the output signal, wherein the digital logic module selectively outputs at least one of the lower and upper bits at an output terminal thereof.

* * * * *